(12) United States Patent  
Nakano

(10) Patent No.: US 7,288,838 B2  
(45) Date of Patent: Oct. 30, 2007

(54) CIRCUIT BOARD FOR MOUNTING A SEMICONDUCTOR CHIP AND MANUFACTURING METHOD THEREOF

(75) Inventor: Hiroaki Nakano, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/756,366

(22) Filed: Jan. 14, 2004

(65) Prior Publication Data

US 2004/0207080 A1 Oct. 21, 2004

(30) Foreign Application Priority Data

Apr. 16, 2003 (JP) ............... 2003-111904

(51) Int. Cl.
*H01L 23/04* (2006.01)
*H01L 23/48* (2006.01)

(52) U.S. Cl. ............ 257/698; 257/690; 257/734; 257/738; 257/780; 257/793

(58) Field of Classification Search ........ 257/793, 257/734, 780, 701, 784, 690, 698, 737–738, 257/750, 787
See application file for complete search history.

(56) References Cited

U.S. PATENT DOCUMENTS 5,407,615 A * 4/1995 Norville .............. 264/36.1
5,467,253 A * 11/1995 Heckman et al. ........... 361/761
6,046,077 A * 4/2000 Baba ......................... 438/127
6,198,165 B1 3/2001 Yamaji et al.
6,259,154 B1 * 7/2001 Niwa ......................... 257/678
6,313,521 B1 * 11/2001 Baba ......................... 257/678
6,365,979 B1 * 4/2002 Miyajima ................... 257/787
6,534,852 B1 * 3/2003 Lin et al. .................... 257/691
6,757,967 B2 * 7/2004 Jimarez et al. ............... 29/840
6,828,665 B2 * 12/2004 Pu et al. ..................... 257/686
6,894,229 B1 * 5/2005 Cheah ........................ 174/255
7,061,080 B2 * 6/2006 Jeun et al. .................. 257/676
2002/0105070 A1 * 8/2002 Shibamoto et al. ......... 257/712

FOREIGN PATENT DOCUMENTS

| JP | A 8-213741 | 8/1996 |
| JP | A 11-284101 | 10/1999 |
| JP | A 2001-15638 | 1/2001 |
| JP | A 2003-92376 | 3/2003 |

* cited by examiner

*Primary Examiner*—Ori Nadav
(74) *Attorney, Agent, or Firm*—Rabin & Berdo, PC

(57) ABSTRACT

It is an object of the invention to provide a circuit board for mounting a semiconductor chip and a manufacturing method thereof that prevent post-reflow warping and prevent peeling of the semiconductor chip and breakage resulting from thermal stress. In the circuit board for mounting a semiconductor chip, wiring regions, in which are formed wirings electrically connected to a semiconductor chip, are disposed on an insulating substrate in a vicinity of a chip region in which the semiconductor chip is mounted. A reinforcement layer, in which is formed reinforcement layers for reinforcing the insulating substrate, is disposed in a vicinity of the wiring regions.

12 Claims, 8 Drawing Sheets

F I G. 3A
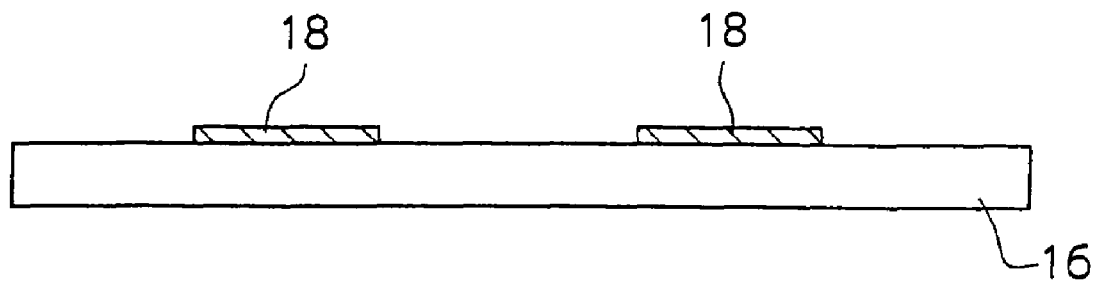
F I G. 3B
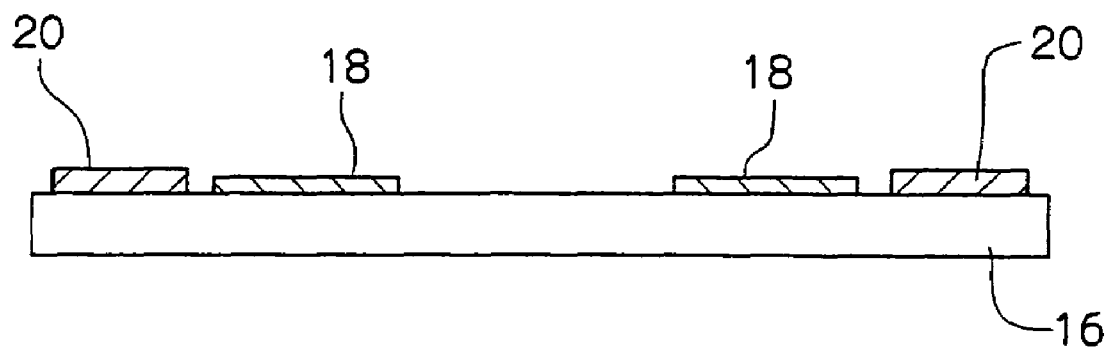
F I G. 3C
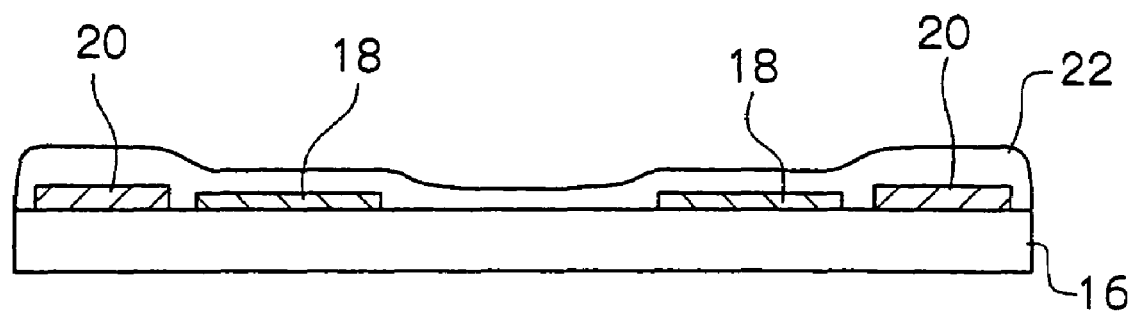

US 7,288,838 B2

CIRCUIT BOARD FOR MOUNTING A SEMICONDUCTOR CHIP AND MANUFACTURING METHOD THEREOF

CROSS-REFERENCE TO RELATED APPLICATION

This application claims priority under 35 USC 119 from Japanese Patent Application No. 2003-111904, the disclosure of which is incorporated by reference herein.

BACKGROUND OF THE INVENTION

1. Field of the Invention

The present invention relates to a circuit board for mounting a semiconductor chip used in a semiconductor device in which a semiconductor chip is packaged, such as a Ball Grid Array (BGA), a Land Grid Array (LGA) or a Chip Size Package (CSP), and also relates to a manufacturing method thereof.

2. Description of the Related Art

In recent years, many external terminal connection terminals have become necessary due to increases in the speed and sophistication of signal processing of semiconductor chips. Thus, as one semiconductor chip package, there is a BGA-type semiconductor device where external terminals are arranged two-dimensionally on a bottom surface thereof. For example, there is a BGA-type semiconductor device where a semiconductor chip is mounted on a circuit board, on which are disposed solder balls arranged two-dimensionally as external electrodes, and the vicinity of the semiconductor chip is sealed with a resin. On this circuit board, wirings electrically connected to external terminals of the semiconductor chip are formed on an insulating substrate, a solder resist (protective film) that protects these wirings is formed, and the semiconductor chip is laminated on a surface of the solder resist.

In this BGA-type semiconductor device, when the semiconductor chip is mounted on a printed board such as a mother board, the two-dimensionally arranged solder balls are soldered at once by reflow on plural pads on the printed board.

However, there is the problem that the circuit board becomes warped due to thermal stress resulting from the reflow. In order to prevent such warping, a reinforcement layer comprising copper or the like has conventionally been formed on the circuit board.

In this circuit board, as shown in FIGS. 6 and 7, the reinforcement layer is formed in a region (reinforcement layer region 132) positioned in a substantially central portion of a circuit board 110 at an inner side of a wiring region 128 (or at inner sides of wiring regions 128) where wirings connected to the external terminals of the semiconductor chip are formed on an insulating substrate 116, whereby the semiconductor chip is mounted above the reinforcement layer region 132.

However, as shown in FIG. 8, when a solder resist 122 is formed so as to cover wirings 118 and a reinforcement layer 120, the surface of the solder resist 122 is uneven along the pattern of the wirings 118 and the reinforcement layer 120, and the semiconductor chip adhering surface is not planar. Thus, for example, problems arise in that pressure from the chip at the time of mounting the semiconductor chip becomes unevenly applied to the chip adhering surface, a liquid adhesive (die-bonding agent) is not evenly coated, an insufficiently filled portion (void) is generated in a semiconductor chip vicinity portion, and peeling of the semiconductor chip and breakage arise due to thermal stress at the time of reflow.

In order to planarize the semiconductor chip adhering surface, a proposal has been made in Japanese Patent Application Laid-Open Publication (JP-A) No. 11-340249 to form wirings on the insulating substrate and form dummy wirings in regions where these wirings are not formed.

However, in JP-A No. 11-340249, although the semiconductor chip adhering surface is planarized in comparison to what has conventionally been the case, unevenness along the pattern of the wirings and the dummy wirings arises in the chip adhering surface, and there is a demand for further improvement.

The present invention solves the above-described conventional problems and seeks to achieve the following object. Namely, it is an object of the invention to provide a circuit board for mounting a semiconductor chip and a manufacturing method thereof where the circuit board is reinforced in order to prevent post-reflow warping and the chip adhering surface is planarized.

SUMMARY OF THE INVENTION

In order to achieve this object, the invention provides a circuit board for mounting a semiconductor chip, the circuit board including a semiconductor chip region for mounting the semiconductor chip and wiring regions in which wirings electrically connected to the semiconductor chip are formed, the circuit board comprising: a reinforcement layer region in which reinforcement layers for maintaining the strength of the circuit board for mounting the semiconductor chip is formed; and a protective film that covers the wirings; wherein the wiring regions are disposed in a vicinity of the semiconductor chip region and the reinforcement layer region is disposed in vicinity of the wiring regions.

In the circuit board for mounting a semiconductor chip of the invention, because the wiring regions are disposed in a vicinity of the semiconductor chip region and the reinforcement layer region is disposed in a vicinity of the wiring regions, the semiconductor chip region is formed by the planar surface of the insulating substrate. Thus, the semiconductor chip adhering surface, which is superposed on the semiconductor chip region of the protective film formed on the insulating substrate, also becomes planar.

In this manner, in the circuit board for mounting a semiconductor chip of the invention, the insulating substrate is reinforced by the reinforcement layers so that post-reflow warping can be prevented, and the chip adhering surface is planarized. Thus, pressure from the semiconductor chip is evenly applied to the chip adhering surface when the semiconductor chip is mounted, a liquid adhesive (die-bonding agent) is evenly coated, and it becomes possible to mount the semiconductor chip without an unfilled portion (void) being generated in the semiconductor chip vicinity portion. Thus, even in a case where an adhesive sheet is used other than the liquid adhesive, the adhesive sheet can be intervened without causing unevenness so that it becomes possible for the semiconductor chip to be mounted without gaps. Thus, peeling of the semiconductor chip and breakage resulting from thermal stress are prevented.

BRIEF DESCRIPTION OF THE DRAWINGS

FIGS. 3A to 3C are process diagrams for manufacturing the circuit board for mounting a semiconductor chip pertaining to the first embodiment of the invention;

DETAILED DESCRIPTION OF THE INVENTION

Figure 1:
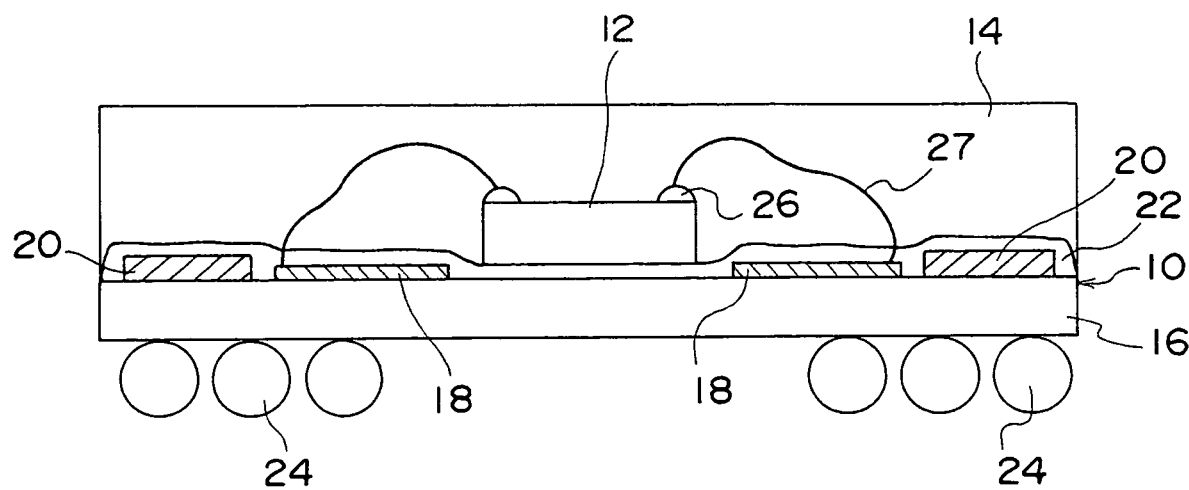
FIG. 1 is a schematic diagram showing the configuration of a semiconductor device of a first embodiment of the invention.

Embodiments of the invention will be described below with reference to the drawings. It should be noted that the embodiments will be described by adding the same reference numerals to portions having substantially the same functions throughout the drawings and that, depending on the case, description of those portions will be omitted.

FIRST EMBODIMENT

Figure 2:
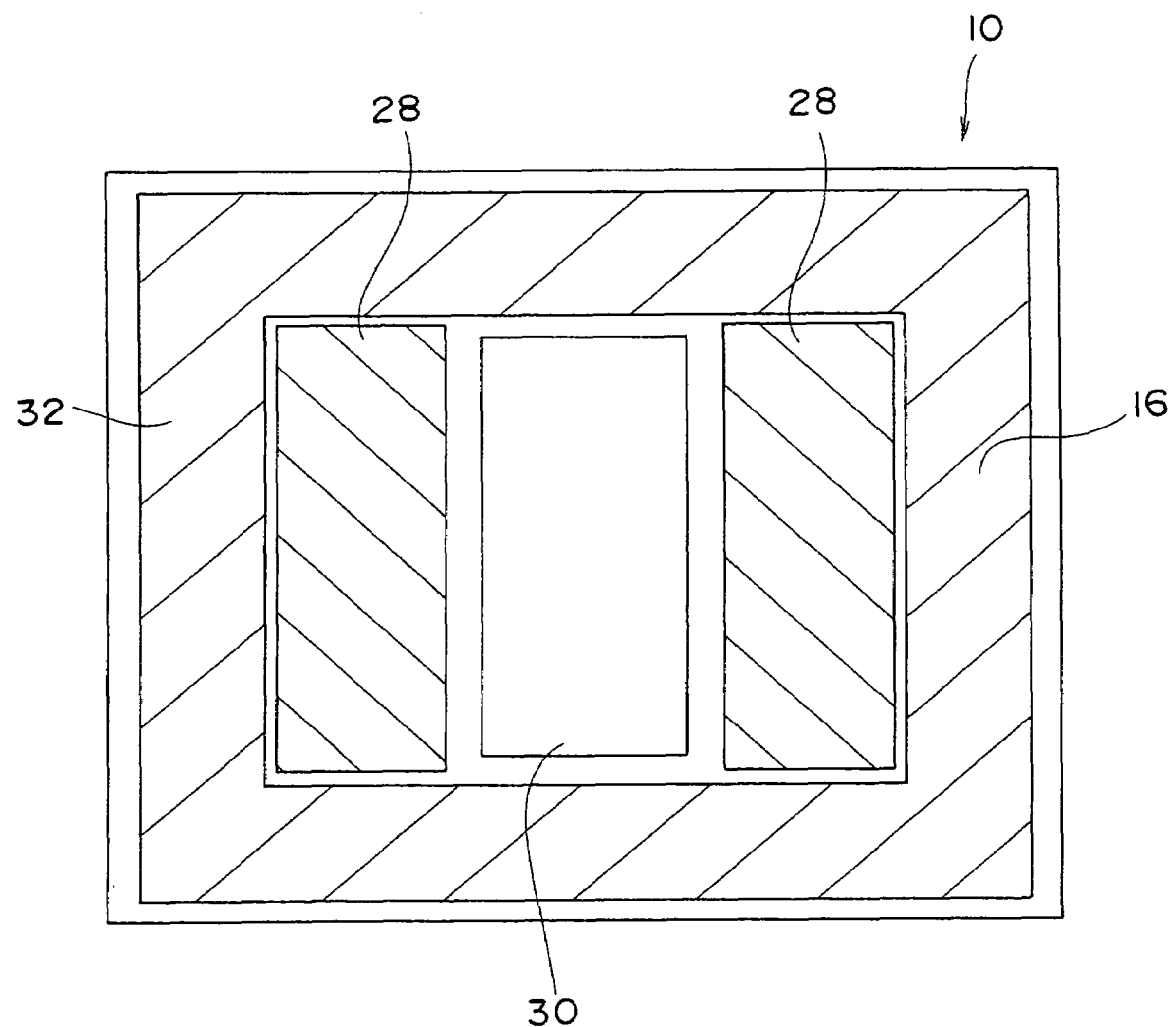
FIG. 2 is a plan view showing a circuit board for mounting a semiconductor chip pertaining to the first embodiment of the invention.

FIG. 1 is a schematic diagram showing the configuration of a semiconductor device of a first embodiment of the invention. FIG. 2 is a plan view showing a circuit board for mounting a semiconductor chip pertaining to the first embodiment of the invention. FIGS. 3A to 3C are process diagrams for manufacturing the circuit board for mounting a semiconductor chip pertaining to the first embodiment of the invention.

In the semiconductor device shown in FIG. 1, a semiconductor chip 12 is mounted on a circuit board 10, with a surface formed with an integrated circuit (opposite from the circuit board 10) facing up, and sealed with a sealing resin 14.

In the circuit board 10, wirings 18 electrically connected to external terminals 26 of the semiconductor chip 12 are formed on an insulating substrate 16 (FIG. 3A), reinforcement layers 20 for reinforcing the insulating substrate 16 are formed (FIG. 3B), and then a solder resist 22 (protective film) for protecting the wirings 18 are formed (FIG. 3C). In the circuit board 10, solder balls 24 (external terminals) electrically connected to the wirings 18 are formed.

As shown in FIG. 2, the insulating substrate 16 is divided into wiring regions 28, a chip region 30 enclosed by the wiring regions 28, and a reinforcement layer region 32 at the peripheral edge portion of the insulating substrate 16 so as to enclose the wiring regions 28. FIG. 2 shows that the semiconductor chip region 30 does not overlap the reinforcement layer region 32, the semiconductor chip region 30 does not overlap the wiring regions 28, and the wiring regions 28 are disposed between the semiconductor chip region 30 and the reinforcement layer region 32. The wirings 18 are formed in the wiring regions 28, and the reinforcement layers 20 are formed in the reinforcement layer region 32. The wirings 18 and the reinforcement layers 20 are formed by plating a metal material such as copper. It should be noted that the reinforcement layers 20 are not limited to a metal material such as copper and may be formed using a conductive material or an insulating material.

The solder resist 22 is formed on the insulating substrate 16 so as to cover the entire surface thereof. Through holes for allowing contact with the wirings 18 are disposed in a part thereof (not shown). A surface of the solder resist 22 is uneven along each pattern at places where the solder resist 22 is superposed on the wiring regions 28 and the reinforcement layer region 32 of the insulating substrate 16, and is planar along the planar insulating substrate 16 surface at the portion where the solder resist 22 is superposed on the chip region 30 (in the present embodiment, this region serves as the semiconductor chip 12 adhering surface).

The solder balls 24 are disposed on the surface of the insulating substrate 16 opposite from the surface on which the wirings 18 are formed. The solder balls 24 are electrically connected to the wirings 18 through the through holes (not shown) disposed in the insulating substrate 16.

The semiconductor chip 12 is mounted, using a liquid die-bonding agent, on the solder resist 22 surface superposed on the chip region 30 of the insulating substrate 16—i.e., on the chip adhering surface.

The semiconductor chip 12 is wire bonded by wiring materials 27 such as metal wires so that the external terminals 26 and the wirings 18 are electrically connected.

In the present embodiment, because the insulating substrate 16 surface of the circuit board 10 (surface on which the chip is mounted) is divided into the wiring regions 28 in which the wirings 18 are formed, the chip region 30 sandwiched between the wiring regions 28, and the reinforcement layer region 32 in which the reinforcement layers 20 are formed, the portion superposed on the chip region 30 of the solder resist 22 covering the insulating substrate 16 surface (i.e., this portion serves as the chip adhering surface) is planar along the planar insulating substrate 16 surface.

Because the portion of the solder resist 22 superposed on the chip region 30 is planar, pressure from the semiconductor chip 12 is evenly applied to the chip adhering surface when the semiconductor chip 12 is die-bonded, a liquid die-bonding agent is evenly coated, and it becomes possible to mount the semiconductor chip 12 without an unfilled portion (void) being generated in the semiconductor chip vicinity portion. Thus, peeling of the semiconductor chip and breakage resulting from thermal stress at the time of reflow stemming from an unfilled portion (void) are prevented.

Also, because the reinforcement layers 20 for reinforcing the insulating substrate 16 are separately formed at the peripheral edge portion of the insulating substrate 16, warping at the time of reflow is prevented.

In the present embodiment, because the reinforcement layer region 32 for reinforcing the insulating substrate 16 is not superposed on the chip adhering surface, it is possible to thicken the reinforcement layers 20 so that warping at the time of reflow is more effectively prevented.

SECOND EMBODIMENT

Figure 4:
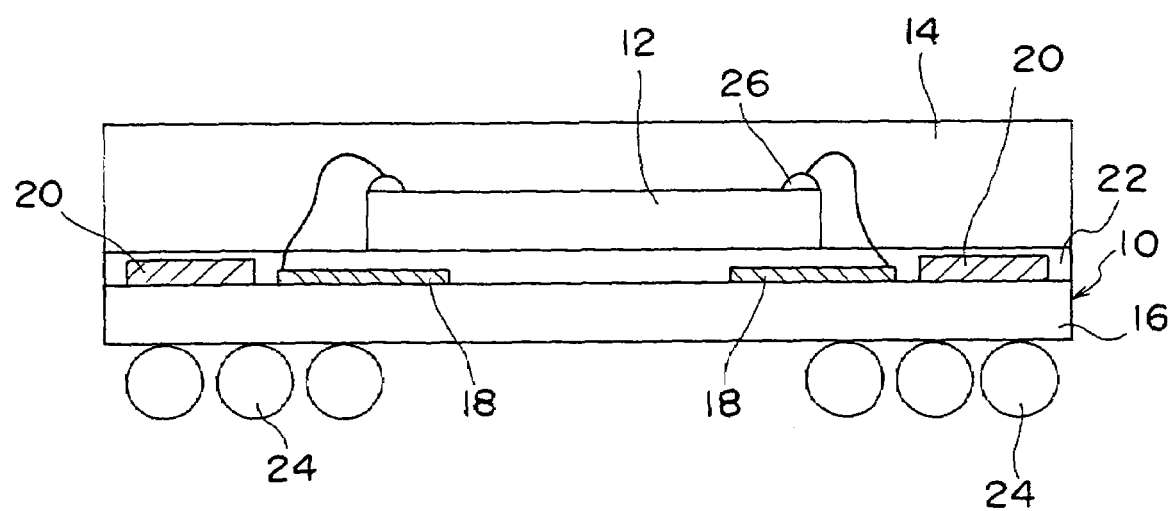
FIG. 4 is a schematic diagram showing the configuration of a semiconductor device pertaining to a second embodiment of the invention.

FIG. 4 is a schematic diagram showing the configuration of a semiconductor device pertaining to a second embodiment of the invention. FIGS. 5A to 5D are process diagrams for manufacturing a circuit board for mounting a semiconductor chip pertaining to the second embodiment of the invention.

As shown in FIG. 4, the present embodiment is a mode where the semiconductor chip 12 is mounted on the circuit board 10 so as to cover the chip region 30 and part of the wiring regions 28.

In the first embodiment, in a case where a semiconductor chip 12 of a size that is larger than the portion of the solder resist 22 superposed on the chip region 30 is mounted, or in a case where the chip region 30 cannot be sufficiently secured, the solder resist 22 is uneven along each pattern at places where the solder resist 22 is superposed on the wiring regions 28 and the reinforcement layer region 32 of the insulating substrate 16. Thus, there is the potential for an unfilled portion (void) to be generated in the mounted semiconductor chip 12 vicinity portion due to this unevenness.

Figure 5A:
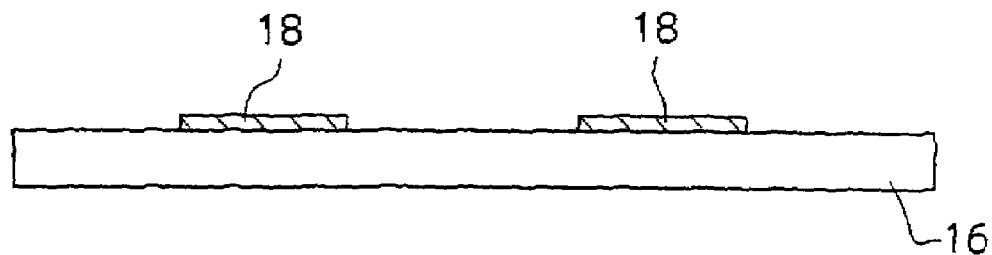
FIGS. 5A to 5D are process diagrams for manufacturing a circuit board for mounting a semiconductor chip pertaining to the second embodiment of the invention.
Figure 5B:
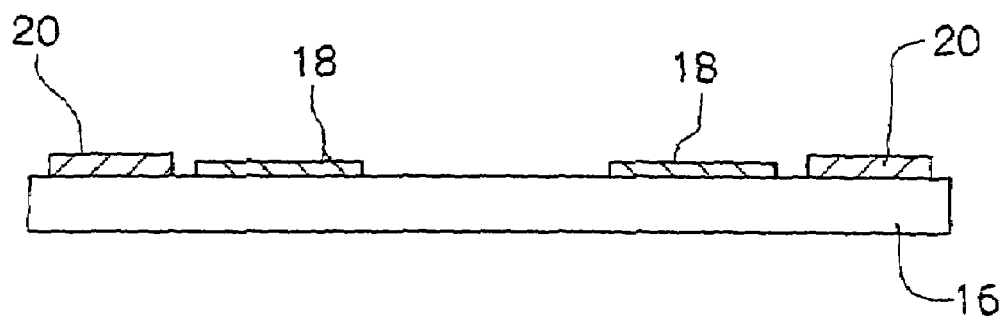
Figure 5C:
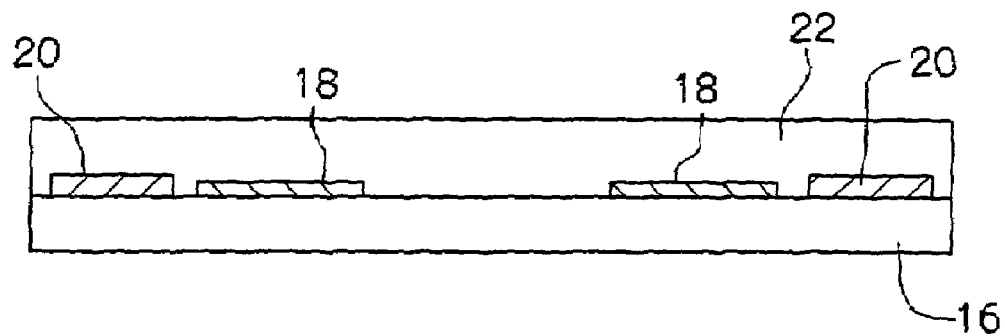
Figure 5D:
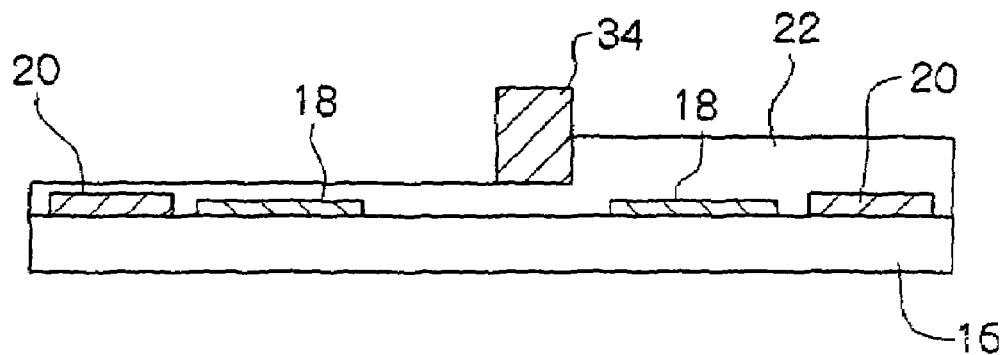
Figure 6:
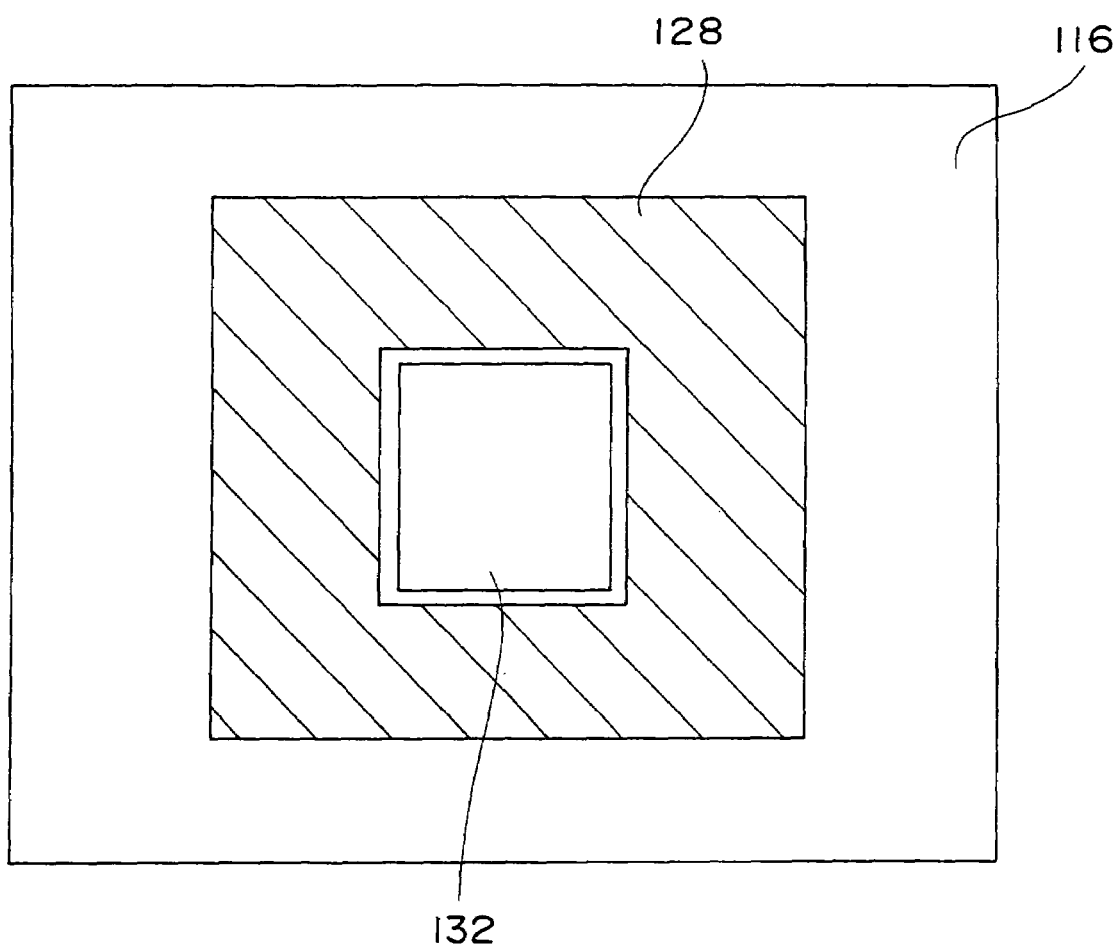
FIG. 6 is a plan view showing a conventional circuit board for mounting a semiconductor chip.
Figure 7:
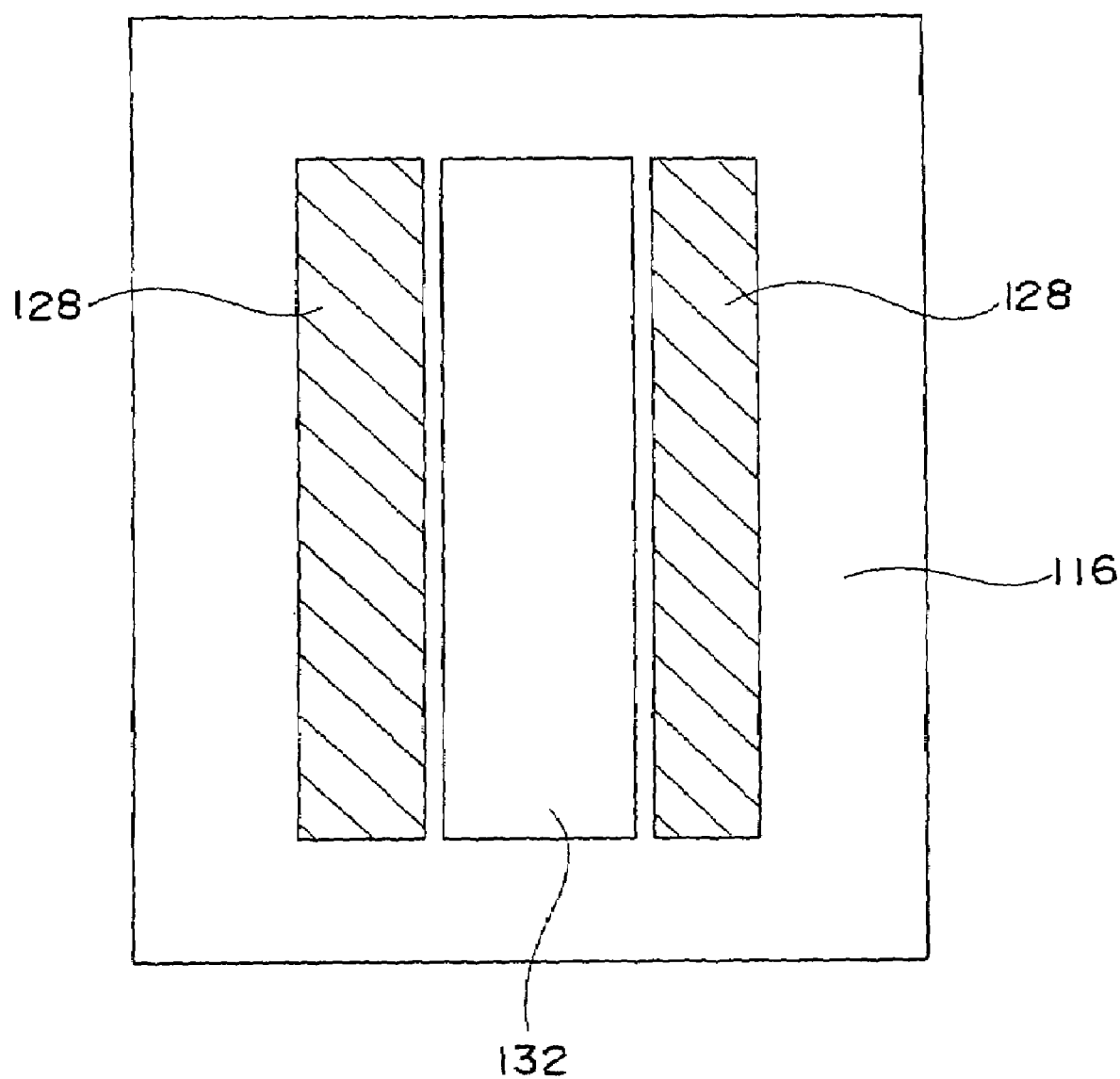
FIG. 7 is a plan view showing another conventional circuit board for mounting a semiconductor chip.
Figure 8:
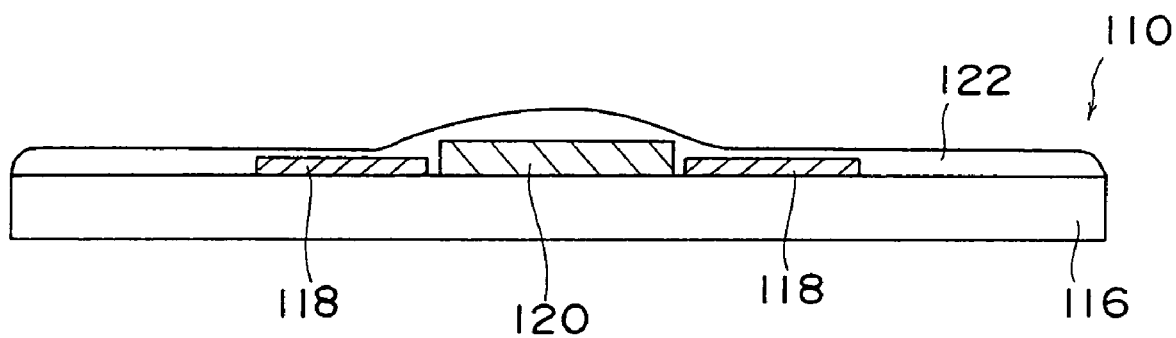
FIG. 8 is a cross-sectional diagram showing the conventional circuit board for mounting a semiconductor chip.

Thus, in the present embodiment, as shown in FIGS. 5A to 5D, the wirings 18 electrically connected to the external terminals 26 of the semiconductor chip 12 are formed on the insulating substrate 16 (FIG. 5A), the reinforcement layers 20 for reinforcing the insulating substrate 16 are formed (FIG. 5B), and the solder resist 22 for protecting the wirings 18 is thickly coated and formed (FIG. 5C). Thereafter, a circuit board 10 manufactured by cutting, polishing and planarizing the solder resist 22 with a polisher 34 is used (FIG. 5D).

Because the rest of the configuration is the same as that of the first embodiment, description thereof will be omitted.

In the present embodiment, because the formed solder resist 22 is planarized, the chip adhering surface itself in the surface of the solder resist 22 becomes planar even if unevenness arises in each pattern of the reinforcement layer region 32 and the wiring regions 28. Thus, similar to the first embodiment, warping at the time of reflow is prevented and the peeling of the semiconductor chip and breakage resulting from thermal stress are prevented, regardless of the size of the semiconductor chip to be mounted.

It should be noted that, although cutting and polishing were conducted using the polisher 34, the above-described planarization is not limited thereto and may also be conducted by CMP (Chemical Mechanical Polishing).

In each of the above-described embodiments, description was given of an example where the semiconductor chip 12 was mounted using a liquid die-bonding agent. However, even in a case where an adhesive sheet is used other than the liquid adhesive, the adhesive sheet can be intervened without causing unevenness so that it becomes possible for the semiconductor chip to be mounted without gaps. Thus, peeling of the semiconductor chip and breakage resulting from thermal stress are prevented.

In each of the above-described embodiments, description was given of an example where a BGA-type semiconductor device was used. However, the invention is also applicable to an LGA-type or a CSP-type semiconductor device.

The invention should not be construed as being limited to either of the above-described embodiments. It goes without saying that the invention can be realized within a range satisfying the requirements of the invention.

What is claimed is:

1. A semiconductor device, comprising:
   a substrate having an upper surface including a chip mounting region, a wiring region and a reinforcement layer region, the regions being independent from each other, the wiring region being located outside of the chip mounting region, the reinforcement layer region being located outside of the wiring region;
   wiring formed in the wiring region;
   a reinforcement layer formed in the reinforcement layer region;
   a protective film that is a solder resist, and that is in direct contact with the substrate, and covers the substrate, the wiring and the reinforcement layer to protect them;
   a semiconductor chip arranged over the chip mounting region and on the protective film;
   a bonding wire that connects the semiconductor chip to the wiring; and
   a sealing resin that seals at least the bonding wire and the semiconductor chip;
   wherein the protective film is disposed under the semiconductor chip, and wherein an upper surface of the protective film is not planar over the wiring and the reinforcement layer, and is planar under the semiconductor chip.

2. The semiconductor device of claim 1, wherein the protective film has a shape corresponding to the surfaces of the wiring, the reinforcement layer and the substrate.

3. The semiconductor device of claim 1, further comprising solder balls provided on a rear surface of the substrate.

4. The semiconductor device of claim 3, wherein the solder balls are electrically connected with the wiring.

5. The semiconductor device of claim 1, wherein the wiring comprises copper.

6. The semiconductor device of claim 3, wherein the solder balls are provided at positions on the rear surface of the substrate corresponding to the wiring region.

7. The semiconductor device of claim 1, wherein a surface of a portion of the protective film positioned in the chip mounting region is planar.

8. The semiconductor device of claim 1, wherein none of the wiring is covered by the semiconductor chip.

9. The semiconductor device of claim 1, wherein the protective film supports the semiconductor chip over the chip mounting region, with the semiconductor chip being separated from the wiring and from the surface of the substrate by the protective film.

10. The semiconductor device of claim 1, wherein the semiconductor chip has a terminal on an upper surface thereof; and wherein said bonding wire that extends from the terminal to the wiring to electrically connect the semiconductor chip to the wiring.

11. A semiconductor device, comprising:
    a substrate having an upper surface including a chip mounting region, a wiring region and a reinforcement layer region, the regions being independent from each other, the wiring region being located outside of the chip mounting region, the reinforcement layer region being located outside of the wiring region;
    wiring formed in the wiring region;
    a reinforcement layer formed in the reinforcement layer region;
    a protective film that covers the substrate, the wiring and the reinforcement layer to protect them;
    a semiconductor chip arranged over the chip mounting region and on the protective film;
    a bonding wire that connects the semiconductor chip to the wiring;
    a sealing resin that covers the semiconductor chip and seals at least the bonding wire and the semiconductor chip; and
    solder balls provided on a rear surface of the substrate;
    wherein the protective film has a shape corresponding to the surfaces of the wiring, the reinforcement layer and the substrate;

wherein the solder balls are electrically connected with the wiring;
wherein the wiring comprises copper;
wherein the solder balls are provided at positions on the rear surface of the substrate corresponding to the wiring region;
wherein the protective film is a solder resist;
wherein a surface of a portion of the protective film positioned in the chip mounting region is planar;
wherein none of the wiring is covered by the semiconductor chip;
wherein the protective film is disposed under the semiconductor chip and supports the semiconductor chip over the chip mounting region, with the semiconductor chip being separated from the wiring and from the surface of the substrate by the protective film;
wherein the semiconductor chip has a terminal on an upper surface thereof;
wherein said bonding wire extends from the terminal to the wiring to electrically connect the semiconductor chip to the wiring; and
wherein an upper surface of the protective film is not planar over the wiring and the reinforcement layer, and is Planar under the semiconductor chip.

12. A semiconductor device, comprising:
a substrate having an upper surface including a chip mounting region, a wiring region and a reinforcement layer region, the regions being independent from each other, the wiring region being located outside of the chip mounting region, the reinforcement layer region being located outside of the wiring region;
wiring formed in the wiring region;
a reinforcement layer formed in the reinforcement layer region;
a protective film that covers the substrate, the wiring and the reinforcement layer to protect them;
a semiconductor chip arranged over the chip mounting region and on the protective film;
a bonding wire that connects the semiconductor chip to the wiring;
a sealing resin that seals at least the bonding wire and the semiconductor chip; and
solder balls disposed on a lower surface of said substrate,
wherein said substrate is disposed over the solder balls, and under the wiring, the reinforcement layer, and the semiconductor chip;
wherein the protective film is in direct contact with the substrate, and has a shape corresponding to the surfaces of the wiring, the reinforcement layer and the substrate;
wherein the solder balls are electrically connected with the wiring;
wherein the wiring comprises copper;
wherein the solder balls are provided at positions on the rear surface of the substrate corresponding to the wiring region;
wherein the protective film is a solder resist;
wherein a surface of a portion of the protective film positioned in the chip mounting region is planar;
wherein none of the wiring is covered by the semiconductor chip;
wherein the protective film is disposed under the semiconductor chip and supports the semiconductor chip over the chip mounting region, with the semiconductor chip being separated from the wiring and from the surface of the substrate by the protective film;
wherein the semiconductor chip has a terminal on an upper surface thereof;
wherein said bonding wire extends from the terminal to the wiring to electrically connect the semiconductor chip to the wiring;
wherein an upper surface of the protective film is not planar over the wiring and the reinforcement layer, and is planar under the semiconductor chip; and
wherein the sealing resin covers the semiconductor chip.

* * * * *